United States Patent
Reay

(10) Patent No.: US 7,656,216 B1
(45) Date of Patent: Feb. 2, 2010

(54) METHOD AND SYSTEM FOR DETERMINING A CLOCK INPUT MODE

(75) Inventor: Richard James Reay, Mountain View, CA (US)

(73) Assignee: Linear Technology Corporation, Milpitas, CA (US)

(*) Notice: Subject to any disclaimer, the term of this patent is extended or adjusted under 35 U.S.C. 154(b) by 4 days.

(21) Appl. No.: 12/068,970

(22) Filed: Feb. 13, 2008

(51) Int. Cl.
  *H03K 3/00* (2006.01)

(52) U.S. Cl. .......................... 327/298; 327/18; 327/63; 327/99

(58) Field of Classification Search .................. None
  See application file for complete search history.

(56) References Cited

U.S. PATENT DOCUMENTS

| | | | | |
|---|---|---|---|---|
| 6,300,816 | B1 * | 10/2001 | Nguyen | 327/407 |
| 6,794,919 | B1 * | 9/2004 | Volk et al. | 327/291 |
| 6,836,156 | B2 * | 12/2004 | Chien | 327/58 |
| 6,933,752 | B2 * | 8/2005 | Dreps et al. | 327/65 |
| 7,183,831 | B2 * | 2/2007 | Ikeda | 327/298 |

* cited by examiner

*Primary Examiner*—An T Luu
(74) *Attorney, Agent, or Firm*—McDermott Will & Emery LLP

(57) ABSTRACT

A method and system is provided for clock input mode selection. When a signal provided on one of two clock input terminals is received, the received signal is considered in connection with a second input signal in order to determine whether the first input signal and the second input signal satisfy a pre-determined condition. Based on whether the pre-determined condition is met, a clock input mode is selected that indicates whether the clock input terminals provide a differential clock input or a single-ended digital clock input.

12 Claims, 8 Drawing Sheets

US 7,656,216 B1

METHOD AND SYSTEM FOR DETERMINING A CLOCK INPUT MODE

BACKGROUND

1. Field of Invention

The teachings presented herein relate to electronic circuitry. More specifically, the teachings relate to methods and systems for clocking in an electronic circuit and electronic circuits incorporating the same.

2. Discussion of Related Art

With the continuous advancement of the semiconductor industry, more and more transistors can be incorporated on a single chip. This translates into the fact that a greater number of functional circuits can be realized on a single chip. As a result, not only has the real estate on an IC chip become increasingly valuable, but also the number of pins that connect the internal circuits on a single chip to the outside world need to be utilized wisely.

A timing signal such as a clock used to drive a circuit on an integrated circuit (IC) is usually supplied via one or more pins. For example, a digital clock signal, or a single-ended digital clock, may be delivered to an IC via a single pin to provide timing information. In another example, a differential analog clock may also be provided in the form of two sinusoidal waves having a certain phase shift in between. A differential analog input is widely utilized especially when the underlying circuit is operating at a high speed to reduce noise and improve precision. However, a disadvantage is its higher power consumption due to the fact that timing information needs to be extracted from the differential analog signals. For instance, timing information such as the rising and falling edges of a clock needs to be identified by, e.g., detecting the zero crossings of two sinusoidal waves.

Modern IC chips often have two pins designated for clock input. By having two pins, it enables a user to apply one of two different clock input modes. The first mode is to supply a single-ended digital input as a clock. The second mode is to supply a differential input based on which a clock can be derived. In the former case, only one pin is needed. In the later case, both pins are needed. Given this flexibility, a user may adopt a specific clock input mode based on the underlying application. Conventionally, to indicate which clock input mode is used, an additional pin is needed for signaling the clock input mode. This is shown in FIG. 1 (Prior Art).

The conventional circuit 100 in FIG. 1 supports a flexible clock input mode. The conventional circuit 100 is connected to three input pins 105, 110, and 115, among which pins 105 and 110 are designated as clock input pins (one for CLK+ and one for CLK−) and the third pin 115 is for signaling whether a single-ended mode or a differential input mode is used. Input pin 105 is for inputting a single-ended clock input which is subsequently sent to a single-ended signal buffer (SE) 125 controlled by a clock mode control circuit 120. The differential input pair (CLK+, CLK−) is provided on both pins 105 and 110 and buffered in a differential clock input buffer (DE) 130, which is also controlled by the clock mode control circuit 120.

The clock mode signal provided on pin 115 is to inform the clock mode control circuit 120 of the clock input mode currently employed. Based on such clock mode information, the clock mode control circuit 120 generates appropriate enabling signals to control either the single-ended signal buffer (SE) 125 or the differential signal buffer (DE) 130 to output a clock signal to a circuit 135.

As shown above, three pins are conventionally necessary in order to support the flexibility of selectable clock input mode. Given that pins are scare resource in modern IC chips, an improved approach is needed that can achieve the flexibility of selectable clock input mode without having to use an additional pin.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

Figure 1:
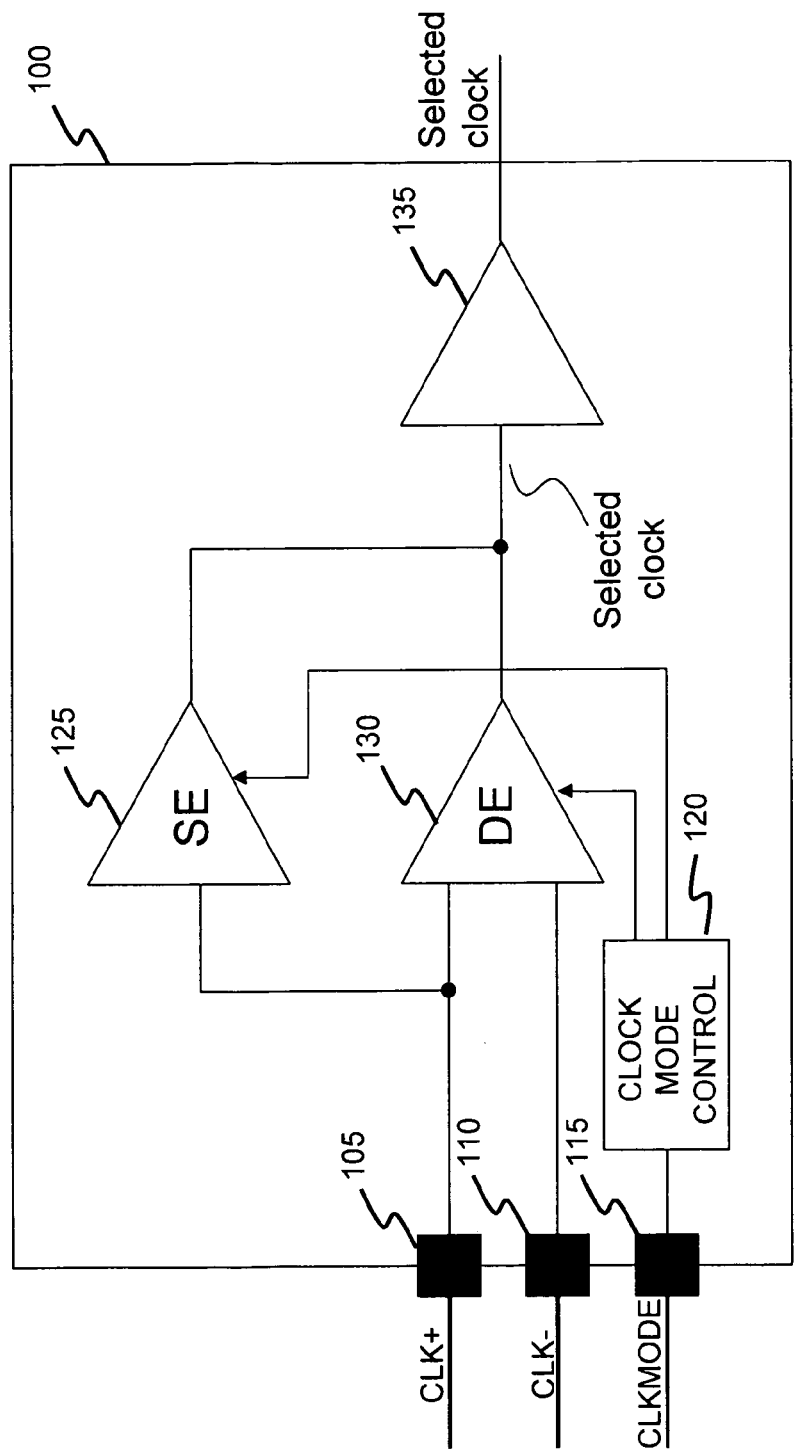
FIG. 1 (Prior Art) shows a conventional circuit coupled to 3 input pins in order to support flexible clock input mode.
Figure 2:
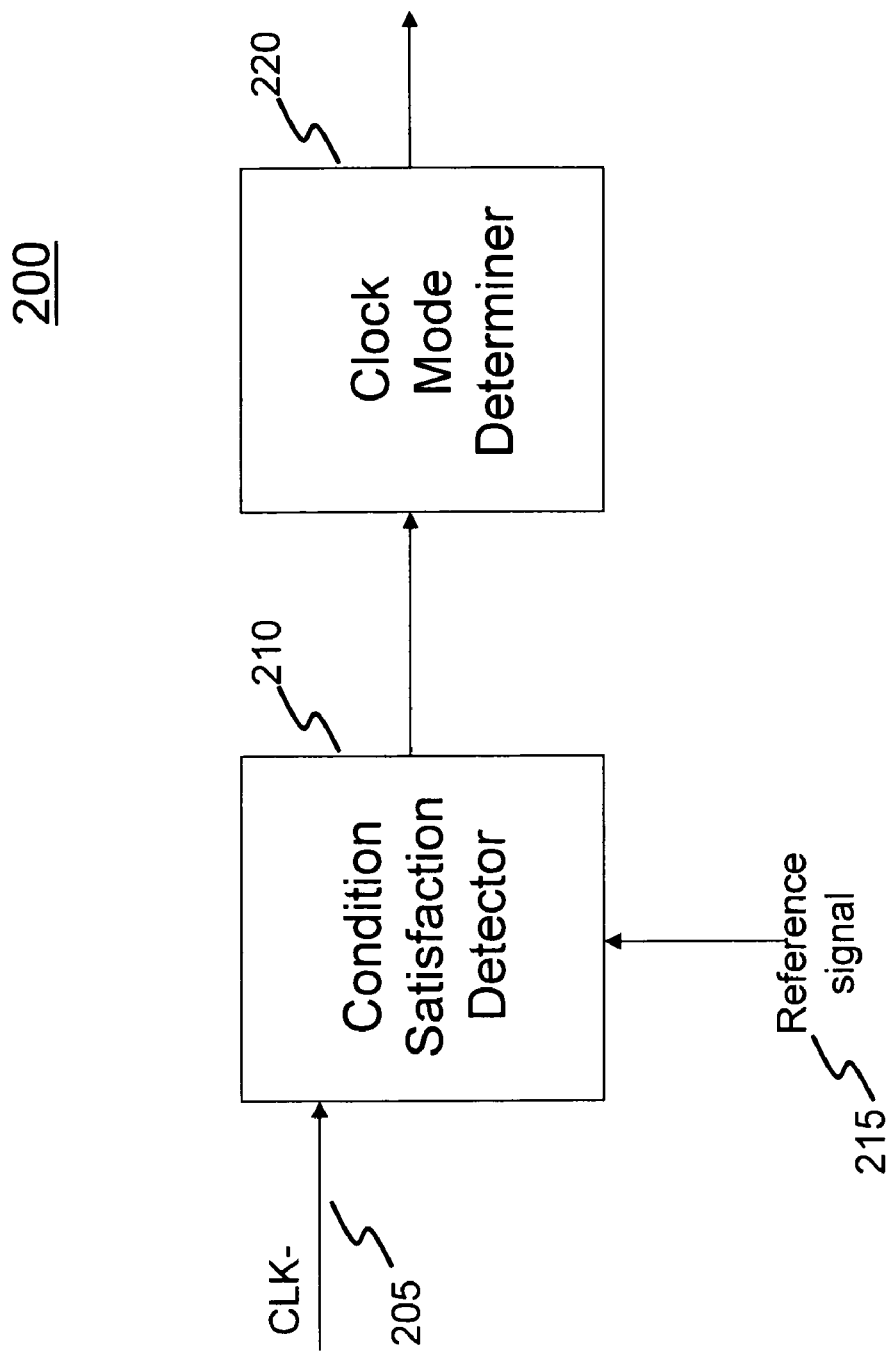
FIG. 2 depicts an exemplary framework in which a clock input mode is determined based on information present on a clock input pin, according to an embodiment of the present teaching.

The present teaching describes methods and systems that support flexible clock input mode without using an additional pin for signaling a clock input mode. FIG. 2 depicts an exemplary framework 200 in which a clock input mode is determined based on information present on a clock input pin, according to an embodiment of the present teaching. The framework 200 comprises a condition satisfaction detector 210 and a clock mode determiner 220. The condition satisfaction detector 210 is an electronic circuit on an IN chip that are coupled to one of the two clock input pins of the IC chip. The condition satisfaction detector 210 receives, as inputs, a signal 205 provided on the pin connected therewith and a reference signal 215 (received, e.g., internally instead of through an input pin). For example, the condition satisfaction detector 210 may be connected to CLK−, one of the two pins for differential inputs. It is understood that it is within the scope of the invention that the condition satisfaction detector 210 may be alternatively coupled to the pin corresponding to CLK+ (not shown).

The condition satisfaction detector 210 is designed to determine whether the signal received via the coupled input pin (e.g., CLK−) and the reference signal satisfy a certain pre-determined relationship. In some embodiments, the pre-determined relationship may be that the voltage of the input signal 205 on CLK− pin is lower than or substantially equal to that of the reference signal 215. In implementation, the reference signal may have a certain voltage, e.g., 200 mV. To enter into the single-ended clock input mode, the CLK− pin may be tied to ground so that it has a voltage less than or substantially equal to (e.g., in the presence of noise) 200 mV. In the meantime, the CLK+ pin is used to provide a single-ended digital clock signal. On the other hand, if the voltage on CLK− pin is higher than that of the reference signal, a differential clock input mode is adopted and in that case, both CLK− and CLK+ pins provide differential analog signal.

Other alternative pre-determined conditions may also be employed. For example, the voltage of the input signal 205 on CLK− pin needs to be higher than or substantially equal to that of the reference signal 215. In this case, the voltage of the reference signal 215 may be set to a high voltage so that when CLK− is tied to the voltage supply line it normally has a higher voltage than that of the reference signal 215.

In accordance with the relationship detected between signal 205 and the reference signal 215, the condition satisfaction detector 210 may then generate an output signal indicating whether the pre-determined relationship is satisfied. For example, if the detected relationship satisfies the pre-determined condition, the output from the condition satisfaction detector is high. Otherwise, the output is low.

Based on the output of the condition satisfaction detector 210, the clock mode determiner 220 then decides the current clock input mode. For instance, if the output from the condition satisfaction detector 210 is high, a single-ended clock input mode is in effect. Otherwise, a differential clock input mode is used. The clock mode determiner 220 may then generate certain output(s) to enable appropriate clock input mode.

In the exemplary framework 200, a signal present on pin CLK− is utilized for determining the clock input mode. A different arrangement can also be implemented to achieve the same goal. For example, the signal on pin CLK+ may be alternatively used for determining the clock input mode. With this implementation, the other pin, i.e., CLK−, is used to deliver a digital clock signal in the single-ended clock input mode.

Figure 3:
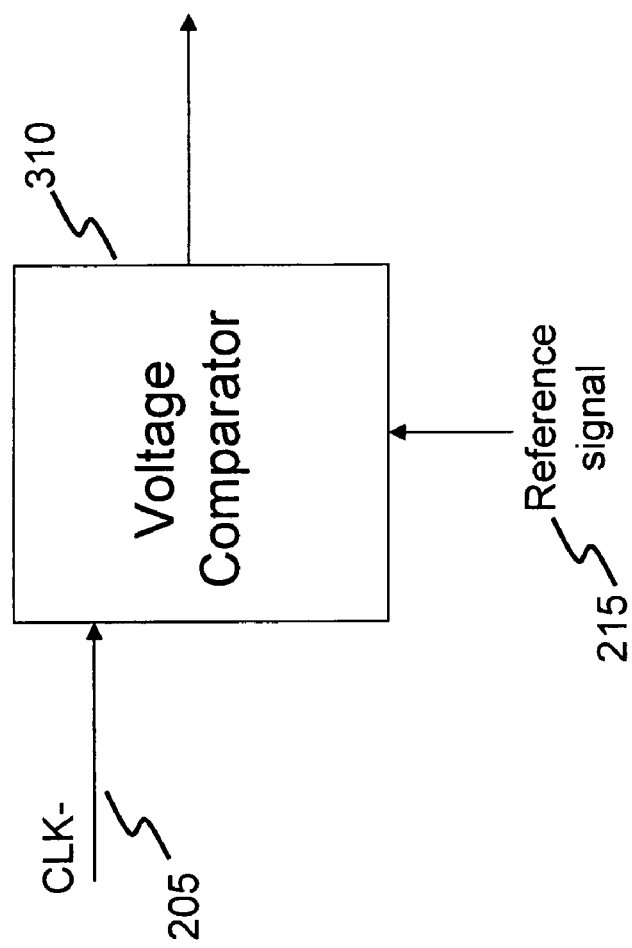
FIG. 3 shows an exemplary implementation of a condition satisfaction detector, according to an embodiment of the present teaching.

FIG. 3 shows an exemplary implementation of the condition satisfaction detector 210, according to an embodiment of the present teaching. A voltage comparator 310 may be designed to compare the voltage of signal 205 on input pin CLK− (or CLK+) and that of the reference signal 215 and to output the comparison result. For example, the voltage comparator 310 may be implemented in such a way that the output of the voltage comparator 310 is high when the voltage of signal 205 and that of the reference signal 215 meet a certain condition (e.g., voltage of signal 205 is lower or substantially equal to that of the reference signal 215) and low when such conditions is not met. Other implementations may also be possible.

Figure 4:
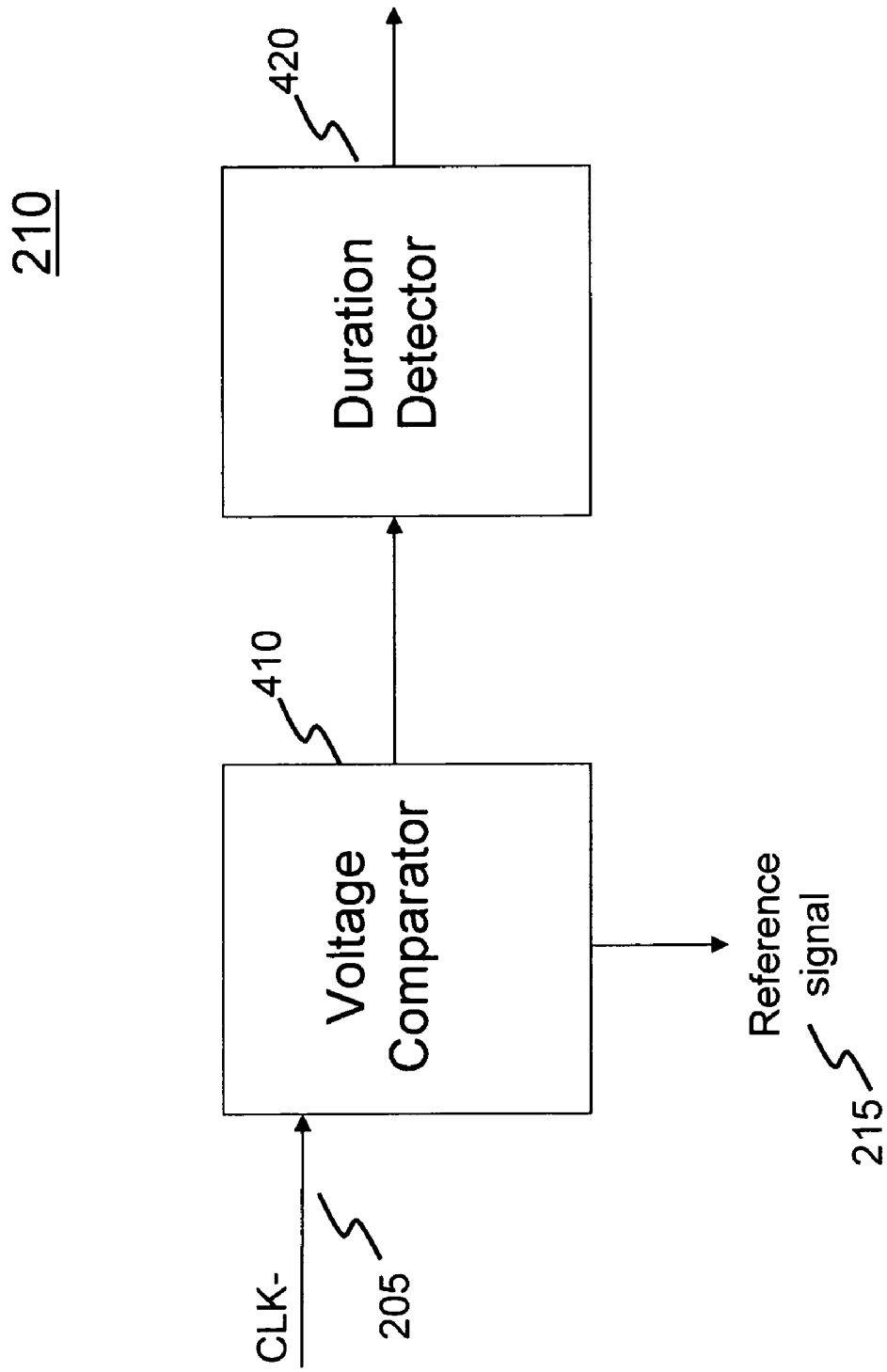
FIG. 4 shows a different exemplary implementation of a condition satisfaction detector, according to an embodiment of the present teaching.

FIG. 4 shows a different exemplary implementation of the condition satisfaction detector 210, according to an embodiment of the present teaching. Compared with the embodiment as illustrated in FIG. 3, this implementation includes both a voltage comparator 410 and a duration detector 420. The functional role of the voltage comparator 410 is the same as that of voltage comparator 310 in FIG. 3. The duration detector 420 is for measuring the duration of a detected condition (e.g., voltage of signal 205 is lower than that of the reference signal 215, detected by the voltage comparator 410) and recognizing a satisfaction of the detected condition only when the condition is detected continuously over a pre-determined period of time. For example, to determine a single-ended clock input mode, CLK− may be required to have a voltage below 200 mV for at least 1 µs. Such a duration may be set in a manner that is consistent with industry practice. For instance, it is known that typical differential clock signals usually do not go below 200 mV for 1 µs. This additional circuit for detecting the duration of a detected condition is to provide robustness of the clock mode selection and prevent false alarm when voltage on CLK− pin briefly goes below (or higher) of a threshold, e.g., 200 mV, due to ringing or noise. The duration detector 420 generates an appropriate output indicating a condition is met when the output by the voltage comparator 410 remains the same continuously over a pre-determined period of time.

Figure 5:
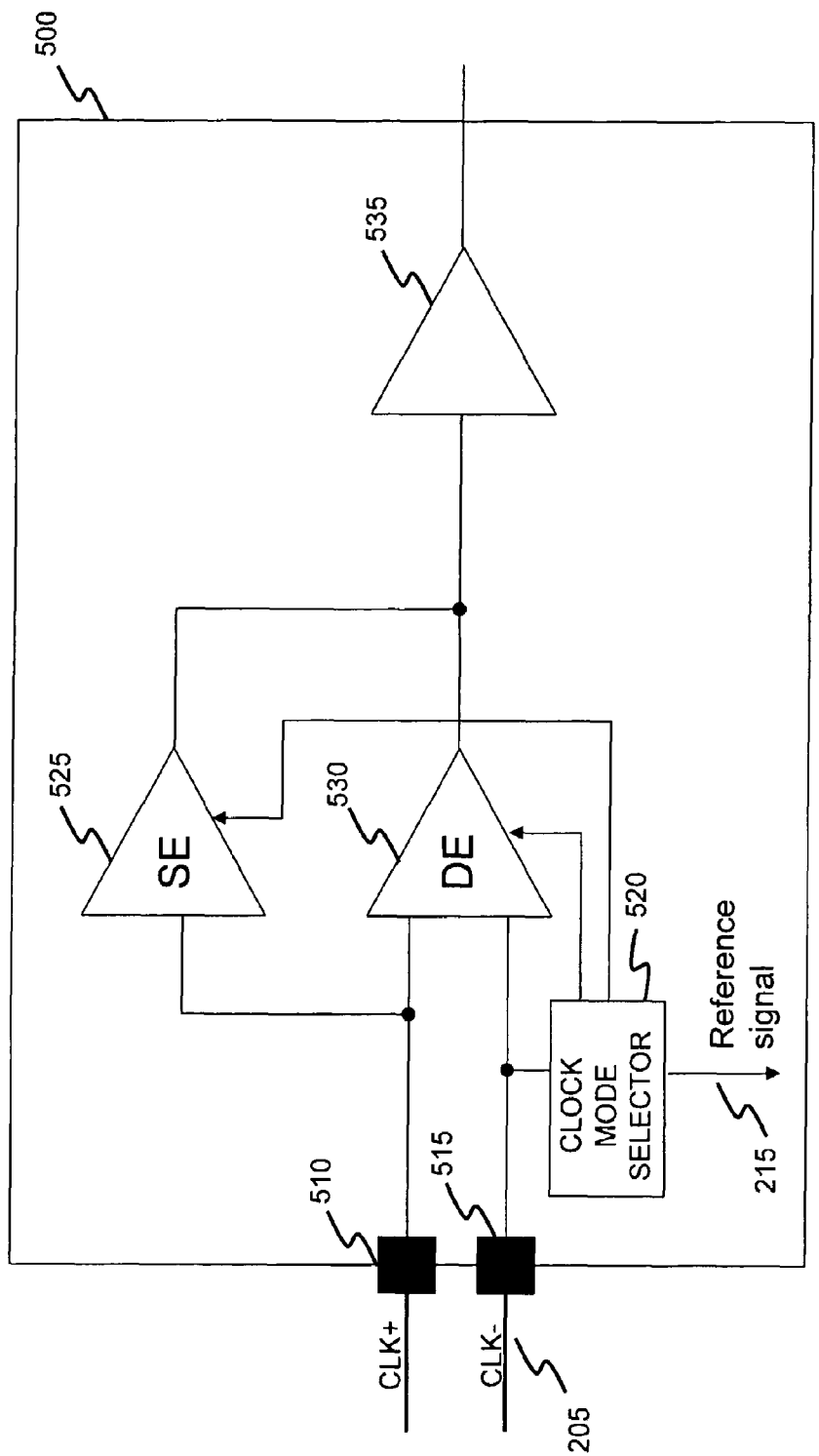
FIG. 5 depicts an exemplary circuit which is capable of dynamically selecting a clock input mode without using an additional pin dedicated for clock input mode control, according to an embodiment of the present teaching.

FIG. 5 depicts an exemplary circuit 500 which is capable of dynamically selecting a clock input mode without using an additional pin dedicated for clock input mode control, according to an embodiment of the present teaching. Circuit 500 is coupled to two input pins 510 and 515. Within the circuit 500, it comprises a single-ended clock buffer 525 (hereafter SE), a differential clock input buffer 530 (hereafter DE), a clock mode selector 520, and a clock output circuit 535. The SE 525 takes its input from input pin 510 and buffers accordingly a single-ended clock input. The DE 530 takes its input from both input pins 510 and 515 and buffers accordingly differential inputs. Both SE 525 and DE 530 are controlled by the clock mode selector 520. That is, the SE 525 outputs the buffered single-ended clock input when it is enabled by the clock mode selector 520. Similarly, the DE 530 outputs the buffered differential clock when it is enabled by the clock mode selector 520. At anytime, only one of the SE and DE is enabled.

The clock mode selector 520 outputs appropriate enabling signals to control both SE 525 and DE 530 based on information received on one of the two clock input pins (e.g., CLK− as shown) and the reference signal 215 in accordance with the exemplary criteria discussed herein. For instance, when the signal provided on input pin CLK− and the reference signal 215 satisfy a pre-determined condition, the clock mode selector 520 generates outputs to, e.g., enable SE 525 and disable DE 530.

Figure 6:
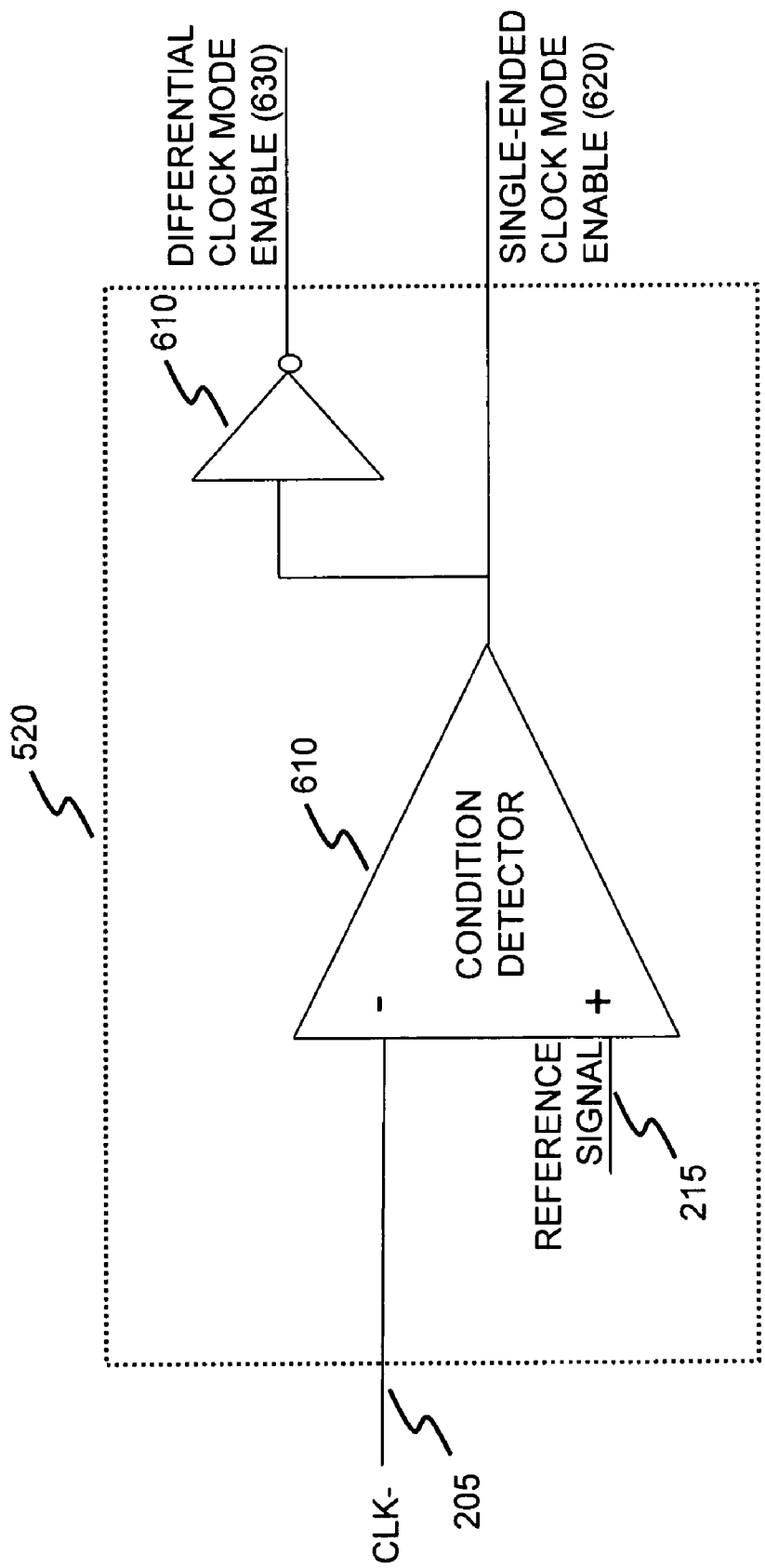
FIG. 6 shows an exemplary implementation of a clock mode selector, according to an embodiment of the present teaching.

FIG. 6 shows an exemplary implementation of the clock mode selector 520, according to an embodiment of the present teaching. A condition detector 610 detects whether a desired condition is present based on the signal received on pin CLK− and a reference signal (e.g., a voltage comparator that detects whether the voltage of the signal provided on pin CLK− and that of the reference signal 215 are substantially similar). The condition detector 610 can be designed to detect any of the relationships between the signal on CLK− and the reference signal as described herein. When a pre-determined relationship is detected, the condition detector 610 outputs a single-ended clock mode enable signal 620 (e.g., a high state) to enable SE 525. In addition, the single-ended clock mode enable signal 620 is sent to an inverter 640 to drive the differential clock mode enable signal 630 low in order to disable DE 530. Similarly, when a pre-determined relationship is not detected, the condition detector 610 outputs, e.g., a low single-ended clock mode enable signal 620 to disable SE 525. In addition, the low single-ended clock mode enable signal 620 is sent to the inverter 640 to generate a high state differential clock mode enable signal 630 to enable DE 530.

Figure 7:
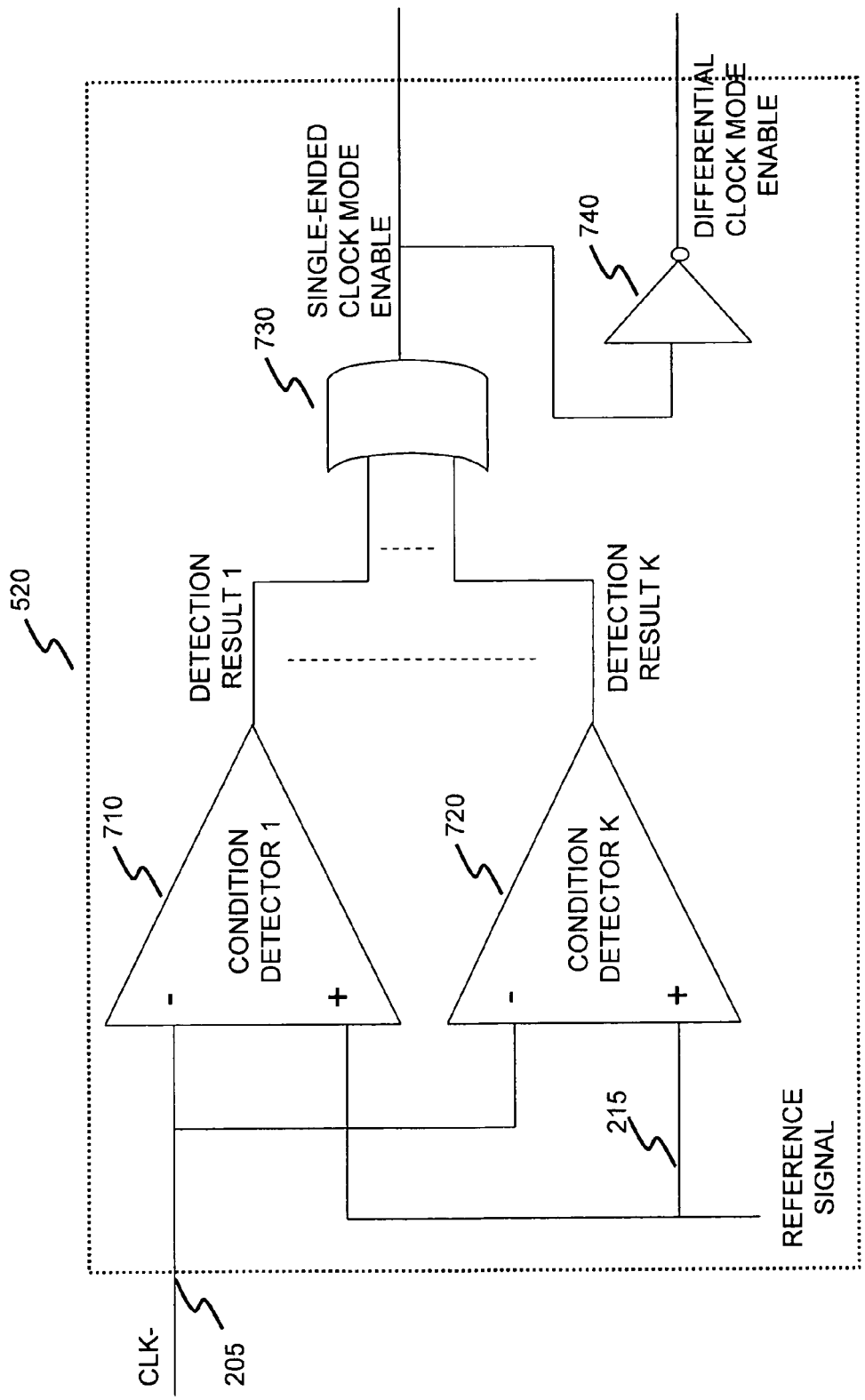
FIG. 7 shows a different exemplary implementation of a clock mode selector, according to an embodiment of the present teaching.

FIG. 7 shows a different exemplary implementation of the clock mode selector 520, according to an embodiment of the present teaching. This embodiment comprises a plurality of condition detectors 710, ..., 720, an integration circuit 730, and an inverter 740. In this illustration, each of the condition detectors may detect one pre-determined condition (e.g., signal on CLK− pin has a lower voltage than that of the reference signal) and the detection results from all of the condition detectors may be integrated by the integration circuit 730. For example, the integration circuit 730 may be an OR gate or an AND gate. The output of the integration circuit corresponds to the overall condition detection result. For instance, if the overall condition to be detected is either the voltage of the signal from CLK− is lower or substantially equal to that of a reference signal, one of the condition detector (e.g., 710) may detect the condition of "lower than" a reference signal A 702 and another (e.g., 720) may detect the condition of "substantially equal to" a reference signal B and the reference signal A is made equal to reference signal B. However, reference signals A and B do not necessarily equal to each other. For example, the condition detector 710 may detect a condition corresponding to "lower than reference signal A", while the condition detector 720 may detect a condition corresponding to "higher than reference signal B". In this case, when the outputs of the two condition detectors are ORed at the integration circuit 730, it produces an enable signal, e.g., single-ended clock input enable signal, whenever either of the condition is met. This output signal may then inverted to produce an inverted signal or a low state differential clock input enable signal.

Figure 8:
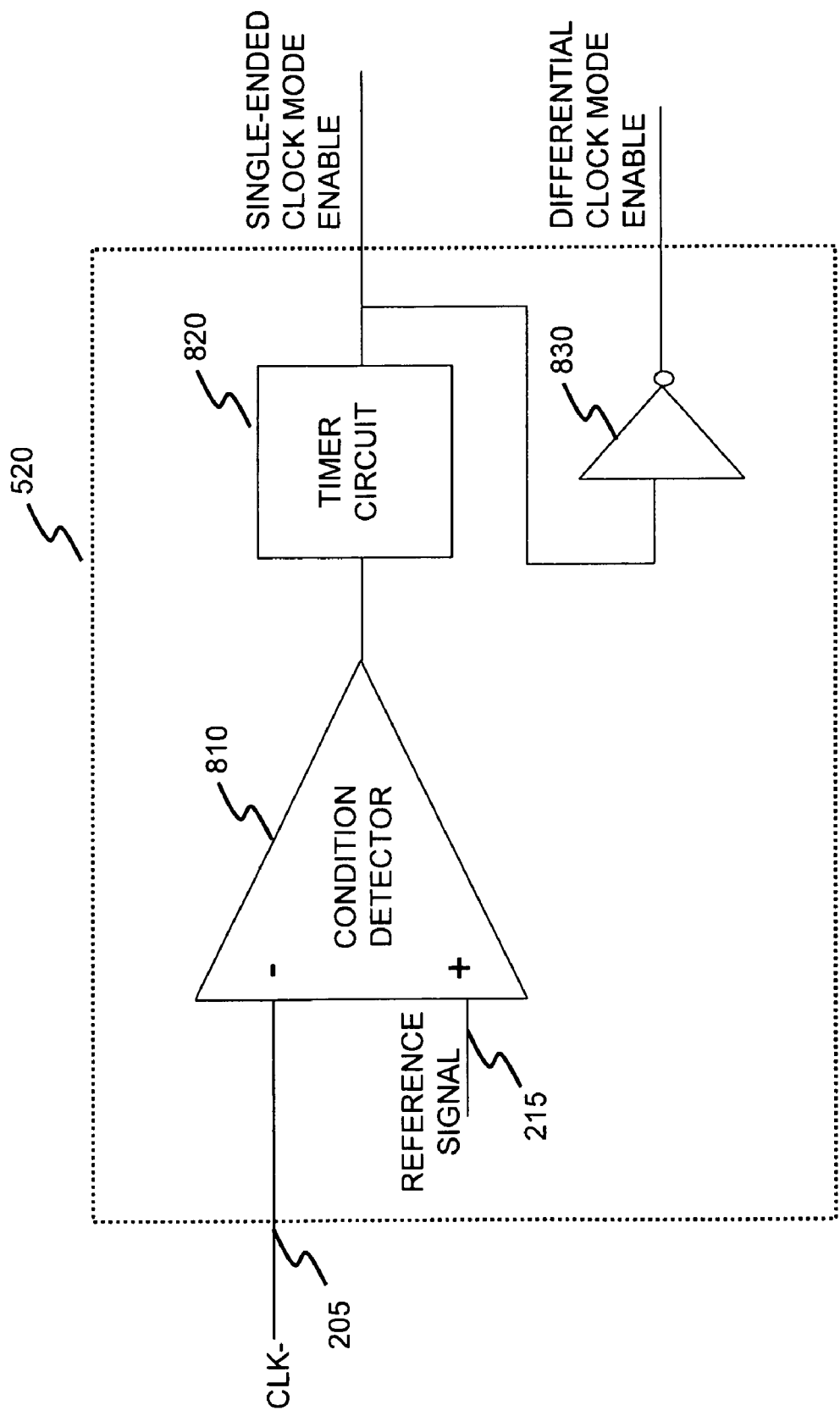
FIG. 8 shows yet another exemplary implementation of a clock mode selector, according to an embodiment of the present teaching.

FIG. 8 shows yet another exemplary implementation of a clock mode selector 520, according to an embodiment of the present teaching. In this embodiment, a condition detector 810 is coupled to a timer circuit 820 that measures the duration of the condition detected by the condition detector 810 before an output enabling signal is generated. The condition detector 810 may be of any implementation as discussed herein (e.g., including a plurality of condition detectors and results of which are integrated as needed). A clock input mode enable signal (e.g., single-ended clock input mode enable) may be generated by the timer circuit 820 after the duration of the detected condition exceeds a pre-determined time period. Such an enabling signal for one clock input mode (whether high state or low state) may then be inverted at inverter 830 to generate an enabling signal associated with the other clock input mode.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A method, comprising:
receiving a first input signal from a first of two terminals designated as clock input terminals;
receiving a second input signal;
determining whether the first input signal and the second input signal satisfy a pre-determined condition, wherein the pre-determined condition includes a first condition and a second condition relating to the duration during which the first condition is met; and
selecting a clock input mode, based on whether the pre-determined condition is met, that indicates whether the clock input terminals provide a differential clock input or a second of the two clock input terminals provides a single-ended digital clock input.

2. The method of claim 1, wherein the first condition is that the voltage of the first input signal is below the voltage of the second input signal.

3. The method of claim 1, wherein the first condition is that the voltage of the first input signal is above the voltage of the second input signal.

4. The method of claim 1, wherein the first condition is that the voltage of the first input signal is substantially equal to the voltage of the second input signal.

5. The method of claim 1, wherein the step of selecting comprises:
generating a first clock mode enabling signal selecting a first clock input mode when the pre-determined condition is met;
generating a second clock mode enabling signal selecting a second clock input mode when the pre-determined condition is not met.

6. A method, comprising:
receiving a first input signal from a first of two terminals designated as clock input terminals;
receiving a second input signal;
determining whether the first input signal and the second input signal satisfy a pre-determined condition, wherein the pre-determined condition includes a first condition;
selecting a clock input mode, based on whether the pre-determined condition is met, that indicates whether the clock input terminals provide a differential clock input or a second of the two clock input terminals provides a single-ended digital clock input, wherein the step of selecting comprises:
generating a first clock mode enabling signal selecting a first clock input mode when the pre-determined condition is met; and
generating a second clock mode enabling signal selecting a second clock input mode when the pre-determined condition is not met;
wherein
the first clock input mode is a single-ended clock input mode; and
the second clock input mode is a differential clock input mode.

7. A clock mode selector, comprising:
a condition satisfaction detector having a first input signal from a first of two clock input terminals and a second input signal and capable of determining whether the first input signal and the second input signal satisfy a pre-determined condition, wherein the condition satisfaction detector comprises a first condition detector capable of detecting satisfaction of a first condition, wherein the condition satisfaction detector further comprises a second condition detector capable of detecting the length of duration during which the first condition is met; and
a clock mode determiner coupled to the output of the condition satisfaction detector and capable of producing a clock mode selection signal indicating whether the clock input terminals provide a differential clock input or a second of the two clock input terminals provides a single-ended digital clock input.

8. The apparatus of claim 7, wherein the first condition is that the voltage of the first input signal is below the voltage of the second input signal.

9. The apparatus of claim 7, wherein the first condition is that the voltage of the first input signal is above the voltage of the second input signal.

10. The apparatus of claim 7, wherein the first condition is that the voltage of the first input signal is substantially equal to the voltage of the second input signal.

11. The apparatus of claim 7, wherein the clock mode determiner:
   outputs a signal indicating a first clock input mode when the pre-determined condition is met;
   outputs a signal indicating a second clock input mode when the pre-determined condition is not met.

12. A clock mode selector, comprising:
   a condition satisfaction detector having a first input signal from a first of two clock input terminals and a second input signal and capable of determining whether the first input signal and the second input signal satisfy a pre-determined condition;
   a clock mode determiner coupled to the output of the condition satisfaction detector and capable of producing a clock mode selection signal indicating whether the clock input terminals provide a differential clock input or a second of the two clock input terminals provides a single-ended digital clock input, wherein the clock mode determiner
   outputs a signal indicating a first clock input mode when the pre-determined condition is met;
   outputs a signal indicating a second clock input mode when the pre-determined condition is not met;
   wherein the first clock input mode is a single-ended clock mode and the second clock input mode is a differential clock mode.

* * * * *